(12) United States Patent
Painter et al.

(10) Patent No.: US 6,741,628 B2
(45) Date of Patent: May 25, 2004

(54) MICRO-CAVITY LASER

(75) Inventors: Oskar Painter, Pasadena, CA (US); Ming Cai, Pasadena, CA (US); Kerry J. Vahala, San Gabriel, CA (US); Peter C. Sercel, Pasadena, CA (US)

(73) Assignees: California Institute of Technology, Pasadena, CA (US); cQuint Communications Corporation, Monrovia, CA (US)

( * ) Notice: Subject to any disclaimer, the term of this patent is extended or adjusted under 35 U.S.C. 154(b) by 0 days.

(21) Appl. No.: 09/802,442

(22) Filed: Mar. 9, 2001

(65) Prior Publication Data

US 2001/0033587 A1 Oct. 25, 2001

Related U.S. Application Data

(60) Provisional application No. 60/188,325, filed on Mar. 9, 2000.

(51) Int. Cl.[7] .................................................. H01S 3/08
(52) U.S. Cl. .............................. 372/92; 372/64; 372/6; 385/129
(58) Field of Search ............................ 372/92, 64, 69, 372/39, 32, 6; 385/129

(56) References Cited

U.S. PATENT DOCUMENTS

| | | | | |
|---|---|---|---|---|
| 4,720,160 A | * | 1/1988 | Hicks, Jr. | 372/6 |
| 5,343,490 A | * | 8/1994 | McCall | 372/92 |
| 5,363,398 A | * | 11/1994 | Glass et al. | 372/92 |
| 5,790,583 A | * | 8/1998 | Ho | 372/92 |
| 6,009,115 A | * | 12/1999 | Ho | 372/92 |

OTHER PUBLICATIONS

Treussart et al; icrolasers based on silica microspheres; Ann.Telecommun., 52, 11–12, pp. 557–568, 1997.*

* cited by examiner

Primary Examiner—Leon Scott, Jr.
(74) Attorney, Agent, or Firm—Bingham McCutchen LLP; Scott R. Miller

(57) ABSTRACT

The present invention is a micro-cavity laser and methods related thereto. In the preferred embodiments, the micro-cavity laser comprises a laser pump signal in a fiber waveguide which is optically coupled to a micro-cavity resonator through a fiber taper. The micro-resonator includes a gain medium necessary for lasing action. The lasing frequency can be determined based upon the gain medium, the micro-cavity structure, as well as frequency selective elements such as gratings incorporated into the micro-cavity. The tapered fiber waveguide permits the micro-cavity laser to operate without a break in the fiber waveguide. In the preferred embodiments, the micro-cavity resonator is constructed from a doped silica or a semiconductor material. The present invention provides a compact laser with improved emissions and coupling efficiencies. Alternative configurations include multiple micro-cavities on a single fiber waveguide and/or utilizing multiple waveguides attached to one or more micro-cavity resonators. The laser can be made to operate in a continuous-wave as opposed to self-pulsing mode.

64 Claims, 9 Drawing Sheets

MICRO-CAVITY LASER

This application claims priority on U.S. provisional application No. 60/188,325, filed Mar. 9, 2000, and entitled, "Fiber-Coupled Microsphere Laser." The disclosure of the foregoing is incorporated by reference herein as if set forth in full hereat.

FIELD OF INVENTION

The field of the invention relates to lasers and certain related methods, and in particular to micro-cavity lasers and related methods.

BACKGROUND OF THE INVENTION

In the now rapidly expanding technology relating to the use of optical waveguides and in particular fiber optic waveguides, a number of discrete devices and subsystems have been developed to modulate, route or otherwise control, optical beams that are at specific wavelengths. Present day communication systems increasingly use individual waveguides to carry densely wavelength multiplexed optical beams. Thus, there is a need for a self-contained device and related methods which can induce a lased output in a frequency range of interest. Currently, the telecommunications industry uses frequencies in the 1550 nm range.

It is known to one of ordinary skill in the art how to couple a waveguide to an optical resonator so as to transfer optical power to the resonator from the waveguide or from the waveguide to the resonator. It is also known to one of ordinary skill in the art that power circulates in a resonator preferentially at resonant frequencies corresponding to optical modes of the resonator. For the purposes of discussion the terms resonance and optical mode will be used interchangeably herein. Likewise the principles associated with lasing action in resonators and in particular rare earth doped resonators and micro-resonators are well understood to one of ordinary skill in the art. The terms micro-cavity, resonator, micro-resonator will be used interchangeably herein. Discussion of these concepts can be found in one or more of the following references, the disclosure of each of which is incorporated by reference herein as if set forth in full hereat: V. Lefevre-Seguin and S. Haroche, Mater. Sci. Eng. B48, 53 (1997); J. C. Knight, G. Cheung, F. Jacques, and T. A. Birks, Opt. Lett. 22, 1129 (1997); M. Cai, O. Painter, and K. Vahala, Phys. Rev. Lett. 85,74 (2000); M. Cai and K. Vahala, Opt. Lett. 25, 260 (2000); V. Sandoghdar, F. Treussart, J. Hare, V. Lefevre-Seguin, J. M. Raimond, and S. Haroche, Phys. Rev. A 54, 1777 (1996); W. von Klitzing, E. Jahier, R. Long, F. Lissillour, V. Lefevre-Serguin, J. Hare, J. M. Raimond, and S. Haroche, Electron. Lett. 35, 1745 (1999); P. Laporta, S. Taccheo, S. Longhi, O. Svelto, and C. Svelto, Opt. Mater. 11,269 (1999); V. B. Braginsky, M. L. Gorodetsky, and V. S. Ilchenko, Phys. Lett. A 137,393 (1989); A. Serpenguzel, S. Arnold, and G. Griffel, Opt. Lett.20, 654 (1995); V. S. Ilchenko, X. S. Yao, and L. Maleki, Opt. Lett. 24,723 (1999); M. L. Gorodetsky and V. S. Ilchenko, J. Opt. Soc. Am.B 16, 147 (1999); T. Baer, Opt. Lett. 12, 392 (1987); G. H. B. Thompson, *Physics of Semiconductor Laser Devices* (Wiley, New York, 1980); T. Mukaiyama, K. Takeda, H. Miyazaki, Y. Jimba, and M. Kuwata-Gonokami, Phys. Rev. Lett. 82, 4623 (1999);

The theoretical concept of inducing lasing action in a micro-resonator doped with Nd is discussed by F. Treussart, et al., in Eur. Phys. J. D 1, 235 (1998), the disclosure of which is incorporated by reference herein as if set forth in full hereat. This reference, however, presents a device which relies on the use of prisms to couple to the laser resonator. Such a configuration presents many difficulties and limitations on its use in the field, as it requires delicate and precise alignment, is bulky and not easily adaptable common use and does not produce an output frequency which is currently of most use in the telecommuting industry. Additional limitations of these and other devices include low emission and coupling efficiencies.

The present invention overcomes these and the other limitations of the prior art by providing a compact, self-containable laser source that is directly coupled to an optical fiber waveguide. Optical fibers, in addition to being very important in modem optical communications systems, provide a very convenient means to convey both optical pump power to the laser as well to convey emitted laser radiation from the laser resonator. The ability to directly couple laser emission to an optical fiber is therefore of great practical significance. The output frequency of the present invention can be tuned both by design (based on choice of certain materials and/or dopants utilized) and dynamically (by varying the frequency of the laser pump signal) and by incorporation of grating structures into the micro-cavity. The present invention also provides a laser source with improved emissions and increased coupling efficiency between the waveguide and the resonator. Finally, the each of the preferred embodiments can be made to be robust and easy to implement in a variety of configurations and uses.

SUMMARY OF THE INVENTION

The present invention is directed to a micro-cavity laser and certain related methods. The devices and methods of the present invention are useful for creating laser signals having a frequency within a desired range by optically coupling an optical pump signal in a waveguide to a micro-cavity optical resonator, which resonator includes an active medium which is capable of providing optical gain upon pump excitation and which resonator and pumped active medium result in lasing action at a frequency within the desired output range. In the preferred embodiments, the waveguide is a fiber waveguide of any configuration and the coupling between the fiber waveguide and the resonator is by means of an optical couple between a fiber taper in the fiber waveguide and the micro-cavity optical resonator. In the preferred embodiment the fiber waveguide serves to both transport optical pump power to the resonator to excite the amplifying medium as well as to collect lasing emission from the laser cavity and transport it to elsewhere. The fiber waveguide and the resonator are preferably critically coupled at the pump wavelength so as to maximize pump power coupling to the active medium. In addition, it is possible and important to phase match the fiber taper and the micro-cavity resonator so as to maximize the coupling efficiency between these two elements of the present invention.

In another embodiment two fiber waveguides are coupled to the micro-cavity and each is optimized for coupling of pump power or collection of laser emission. In this embodiment phase matching could be employed to perform this optimization.

The micro-cavity optical resonator can have a variety of shapes including, without limitation, a microsphere, one or more micro-rings, racetracks or disks incorporated on a substrate or one or more micro-rings or disks formed on the fiber waveguide itself. Indeed, it is preferable in certain applications for there to be more than one micro-cavity resonator on a single fiber waveguide, for example in creating a multi-wavelength laser array along the fiber waveguide.

The output of the micro-cavity laser of the present invention can be tuned by varying the pump wavelength and/or utilizing different material composition for the micro-cavity optical resonator. In addition, internal structures such as optical gratings can be added to the optical path within the resonator so as preferentially select a particular optical mode for lasing and in turn the frequency. The laser can also be made to operate continuous wave or self-pulsing.

Accordingly, it is an object of the present invention to provide a micro-cavity laser having the advantages detailed herein.

This and other objects of the invention will become apparent to those skilled in the art from a review of the materials contained herein.

BRIEF DESCRIPTION OF THE DRAWINGS

The accompanying drawings, which are incorporated in, and constitute a part of the Specification, illustrate presently known preferred embodiments of the present invention, and together with the proceeding general description and the following Detailed Description, explain the principles of the invention.

In the drawings.

DETAILED DESCRIPTION OF THE INVENTION

Figure 1:
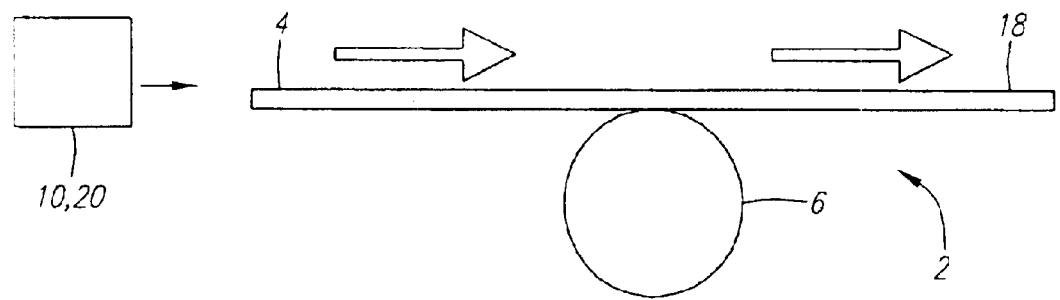
FIG. 1 is an illustration of a micro-cavity laser of the present invention.
Figure 2:
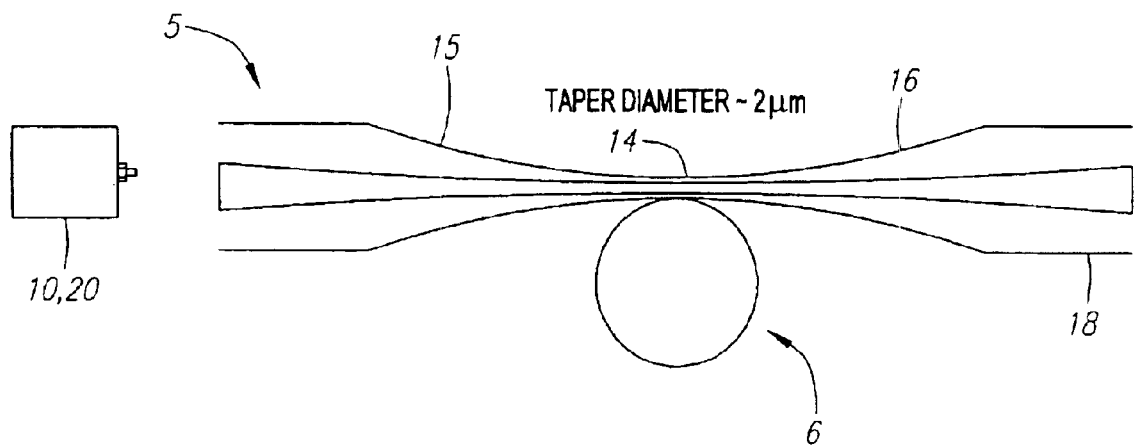
FIG. 2 is a plan view illustration of a fiber taper and a micro-cavity resonator.

Referring hereafter to the figures generally, and in particular to FIGS. 1–2 here, the present invention is a compact and highly efficient laser 2. In its preferred embodiment, the present invention utilizes transmission media 4; high-Q micro-cavity optical resonators 6; active media associated with the optical resonators to facilitate the lasing of a signal within a frequency band of interest; and, optical pumps to excite the active media. As described below and as will be understood by those skilled in the art, numerous additional implementations of this structure and/or method can be made without departing from the scope or spirit of the invention as described herein.

The transmission media 4 is preferably a fiber waveguide 5 of any type. This includes, without limitation, cylindrical, elliptical, etched, "D"-shape and "panda" fiber configurations as well as polished fiber half-blocks. In the preferred embodiment, a fiber taper 12 is provided in the fiber waveguide 5 between a first and second end of the fiber waveguide 5 as is best illustrated in FIG. 2. The tapered sections, 15, 16 and intermediate waist region 14 of the waveguide may be provided, as is known, by stretching the waveguide under controllable tension as it is softened by one or more fixed or movable heat sources (e.g., torches). Commercially available machines can be used for this purpose in production environments. The consequent reduction in diameter of about one or more orders of magnitude reduces the central core in the core/cladding structure of the optical fiber to vestigial size and function, such that the core no longer serves to propagate the majority of the wave energy. Instead, without significant loss, the wave power in the full diameter fiber transitions into the waist region, where power is confined both within the attenuated cladding material and within a field emanating into the surrounding environment. After propagating through the waist region 14, exterior wave power is recaptured in the diverging tapered region 16 and is again propagated with low loss within the outgoing fiber section 18, as illustrated in FIGS. 1 and 2.

The high Q resonator 6 in this example is coupled to the externally guided power about the waist region 14 of the waveguide. That is, at all times there is a coupling interaction from the principal fiber into the interior of the resonator 6 via the resonator periphery. The resonator 6 additively recirculates the energy with low loss in the whispering gallery mode ("WGM" or WG mode"), returning a part of the power to the waveguide at the waist 14. When a resonance exists at the chosen wavelength, the resonator 6 functions with effectively total internal reflection and with minimal internal attenuation and radiative losses. However, the emanating portion of the wave power is still confined and guided, so it is presented for coupling back into the waveguide waist 14. Extremely high Q values (as much as 8 billion have been observed) exist in this whispering gallery mode. Different WGM devices can be used for the present invention, including disks, rings, polygons, oblate and prolate spheroids. Furthermore, concentricity or approximate concentricity may in some instances not be necessary, since the WGM effect can exist in non-concentric boundary structures such as ellipses or race-track structures.

In the present invention, the resonator 6 is preferably constructed from a silica material. This provides the advantage of being compatible with many waveguide structures, most importantly, telecommunication fiber waveguides currently in use. Alternatively, resonators can be constructed in a semiconductor, utilizing any of the resonator configurations (e.g., disks, rings, polygons, oblate and prolate spheroids) discussed herein. Depending on the application in which the laser of the present invention might serve and/or the desired frequency bandwidth of the output, the material from which the resonator is constructed may also include one or more additives (for example and without limitation, phosphate) intended to suppress undesirable higher order modes and/or resonances in the resonator 6 at frequencies outside of the desired output bandwidth.

In order for the micro-cavity resonator 6 to lase within a desired frequency bandwidth, an active media must also be present. The active media produces the optical gain necessary to permit lasing once excitation of the structure is initiated by one or more optical pump sources. In the preferred embodiments, the present invention utilizes one or more dopants in the resonator 6 to serve as the active media. The preferred dopants include rare earth materials and particularly erbium, ytterbium, praseodymium, neodymium, holmnium, and thulium, either alone or in combination with another dopant. The exact combination and concentration of dopants depends on the wavelength band or bands sought to be included in the output of the laser of the present invention.

The present invention also utilizes an alignment structure in order to secure the position of the fiber waveguide 6 relative to the micro-cavity resonator 20. Many types of alignment structures are known to those of ordinary skill in the art and may include, without limitation, an etched substrate or the like. In addition, an alignment structure may include structures of the type disclosed in pending U.S. patent application Ser. No. 09/788,301, the disclosure of which is incorporated herein in full by reference. Illustrations of these and other embodiments are set forth in Vahala, et al., U.S. patent application entitled "Resonant Optical Filters", Ser. No. 09/788,300, filed Feb. 16, 2001, the disclosure of which is incorporated herein by reference.

To induce a lasing action in the present invention, an excitation signal must be provided to the resonator 6. In the first preferred embodiment, an optical pump 20 is provided to deliver the excitation signal to the resonator 6. Alternative schemes of delivering an excitation sources (e.g., and without limitation, by beam excitation including guided or unguided electrical and/or unguided light beams) can be employed without departing from the scope of the present invention.

Figure 5:
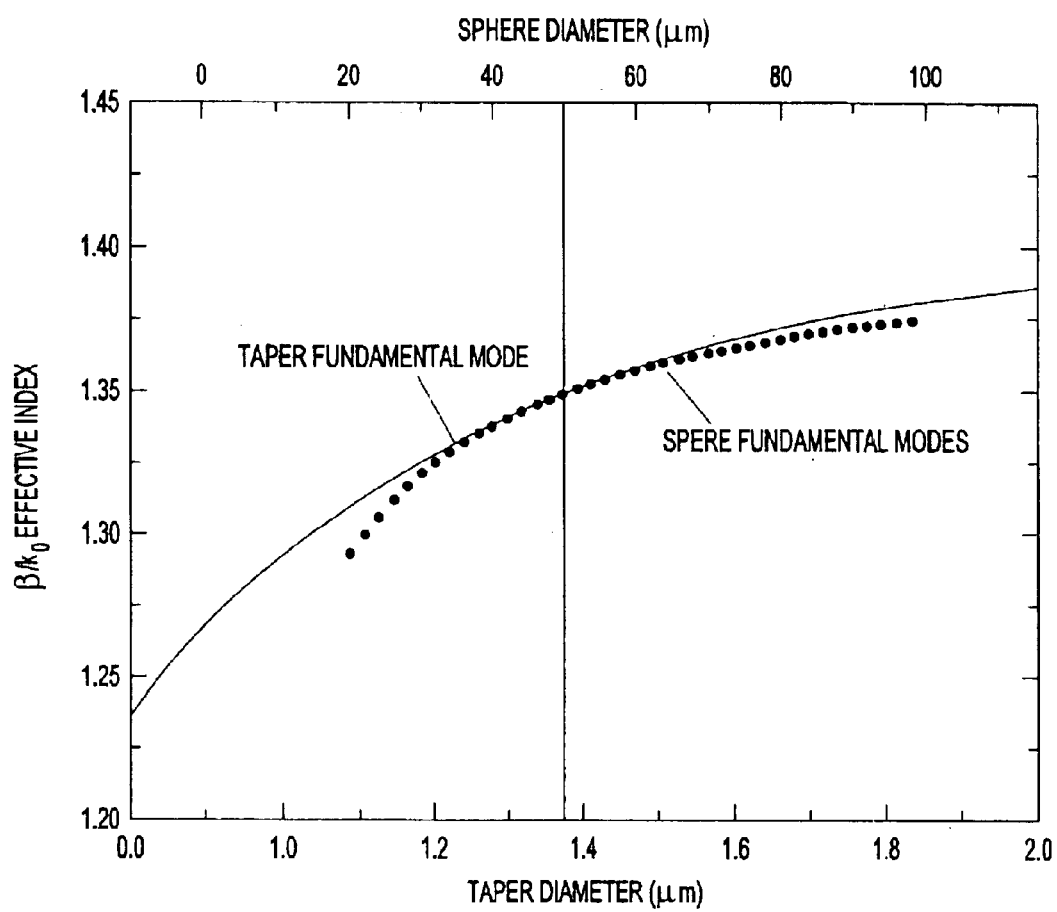
FIG. 5 is a graph illustrating the phase matching of a fiber taper fundamental mode and a microsphere resonator fundamental modes.

Without limiting the foregoing, in the first preferred embodiment an optical pump 20 is optically connected to a first end of the fiber waveguide 5. The optical pump 20 transmits a signal along the waveguide 5 and to the resonator 6 through the fiber taper 12 as discussed above. One or more excited laser signals in the resonator 6 are then communicated to the fiber waveguide 5 propagating both in the direction of the second end of the waveguide as illustrated in FIG. 5 (and towards the first end of the waveguide). In an alternative embodiment where the resonator is constructed from a semiconductor, the resonator 6 is preferably pumped by an electrical excitation signal rather than an optical signal, however, pumping in this configuration by a guided or unguided optical or alternative signal beam is also intended to be included within the scope of the present invention.

A significant advantage of the present invention over the work of others is the ability to couple directly to and from optical fiber. Important to this coupling is the ability to "phase match" the fiber taper 12 and the resonator structure 6 to maximize the coupling efficiency. This is done by proper selection of the diameter of the fiber taper 12 at the waist region 14. In so doing, it is possible to match the effective indexes of the fundamental taper mode and the fundamental mode of the resonator 6 (i.e., "phase matching"). As illustrated in FIG. 5, where the resonator 6 is a microsphere 7, a 50 micron diameter microsphere 7 phase matches a 1.38 micron diameter fiber taper 12. In the present invention, it is possible to demonstrate critical coupling with 26-dB on-resonance extinction and a matched dual-taper add-drop filter with less than 0.5% scattering loss and near-unity power transfer (on-resonance) between a fiber taper 12 and a micro-cavity resonator 6, where the resonator is a microsphere resonator 7.

A laser of the present invention has been constructed and tested in the laboratory, and is described more fully below. It will be appreciated that this embodiment is but one of many embodiments of the invention disclosed and claimed herein and is described as the currently known best mode of the present invention rather than as a limitation of the invention itself.

In this embodiment and referring to all of the figures generally, a fiber taper 12 is placed in contact with Er:Yb-doped phosphate glass microsphere 9, to form a compact, low-threshold 1.5 mm wavelength fiber laser source. A single fiber taper 12 is used to guide the pump 20 laser beam to the surface of the microsphere 9, resonantly couple the pump 20 into the sphere 9, and then collect the resulting laser emission. The use of a fiber taper 12 not only provides an efficient input and output coupling port but also plays an important role in producing single-mode lasing. Finally, the fiber taper 12 forms a natural backbone for connecting a series of different active and passive micro-cavity devices, with each device addressing a different wavelength signal. These additional micro-cavity devices can be resonators, modulators, add/drop filters, slicers, or any other device which can optically connected to the fiber waveguide 5, preferably through the fiber taper 12 or one or more additional fiber tapers on the fiber waveguide 5 so as to make such connections without breaking the fiber waveguide 5.

The microspheres used in this embodiment were formed from phosphate glass heavily doped with Yb (20% by weight) and Er (0.5%). Kigre QX/Er phosphate glass has a transformation temperature of 450° C and a refractive index of 1.521 at 1.5 $\mu$m. Absorption that is due to the $F_{5/2} \rightarrow F_{7/2}$ transition of the $Yb^{3+}$ ions is strongly peaked around 976 nm ($\pm$5 nm), with a value of $\alpha$=4–5 cm$^{-1}$ ($2 \times 10^3$ dB/m). The $F_{7/2}$ level of $Yb^{3+}$ resonantly couples to the $Er^{3+}I_{11/2}$ level, which then relaxes to the $I_{13/2}$ level. The 1.5-$\mu$m lasing transition is between the ground-state $I_{15/2}$ level and the $I_{13/2}$ excited-state level of $Er^{3+}$, with a fully inverted gain per unit length exceeding 200 dB/m in the 1500 nm band.

Fabrication of the microspheres and the fiber tapers is discussed in the references cited above and incorporated herein. In summary, a small piece of the phosphate glass is melted in a crucible. With the phosphate still molten, the tip of a silica fiber taper, which has a higher melting point, is placed into the melt. As the silica "stem" is extracted, a small phosphate taper is formed on the end of the silica taper. A $CO_2$ laser is used to melt the end of the phosphate taper, forming a spheroid under surface tension. The silica fiber stem is finally placed in a fiber chuck and used as a handling rod to control and position the phosphate sphere. It is important to carefully control the temperature of these operations and to cool the sphere quickly in a manner which avoids crystallization of the phosphate in the spheroid to an extent which would interfere with the reflective properties of the spheroid as a micro-cavity optical resonator.

The fiber tapers for this embodiment were formed by taking standard telecommunication 125 $\mu$m diameter silica fiber, heating a short region with a torch, and then slowly pulling the fiber ends to form an adiabatic taper region. In order to provide efficient coupling between the fiber taper 12 and the microsphere, a fiber taper diameter must be tailored for each different sphere size and WG mode of interest as described above. Fine tuning of the coupling can further be performed by changing the position of the sphere relative to the taper waist.

The resonant modes of nearly spherical dielectric particles can be classified according to their polarization index p, radial mode number n, and angular mode numbers l and m. Of special interest in this embodiment are the WGM resonances, i.e., those with small radial mode numbers and large angular mode numbers. Excitation of WGMs within glass microspheres 7 via a fiber-taper 12 coupling has several distinct advantages. Most important of these is direct coupling to and from the optical fiber. In addition, alignment is built in, fabrication is relatively simple, and as discussed above, index matching between the fiber taper 12 and the diameter of the WGMs of the microsphere 9 is possible.

Figure 3:
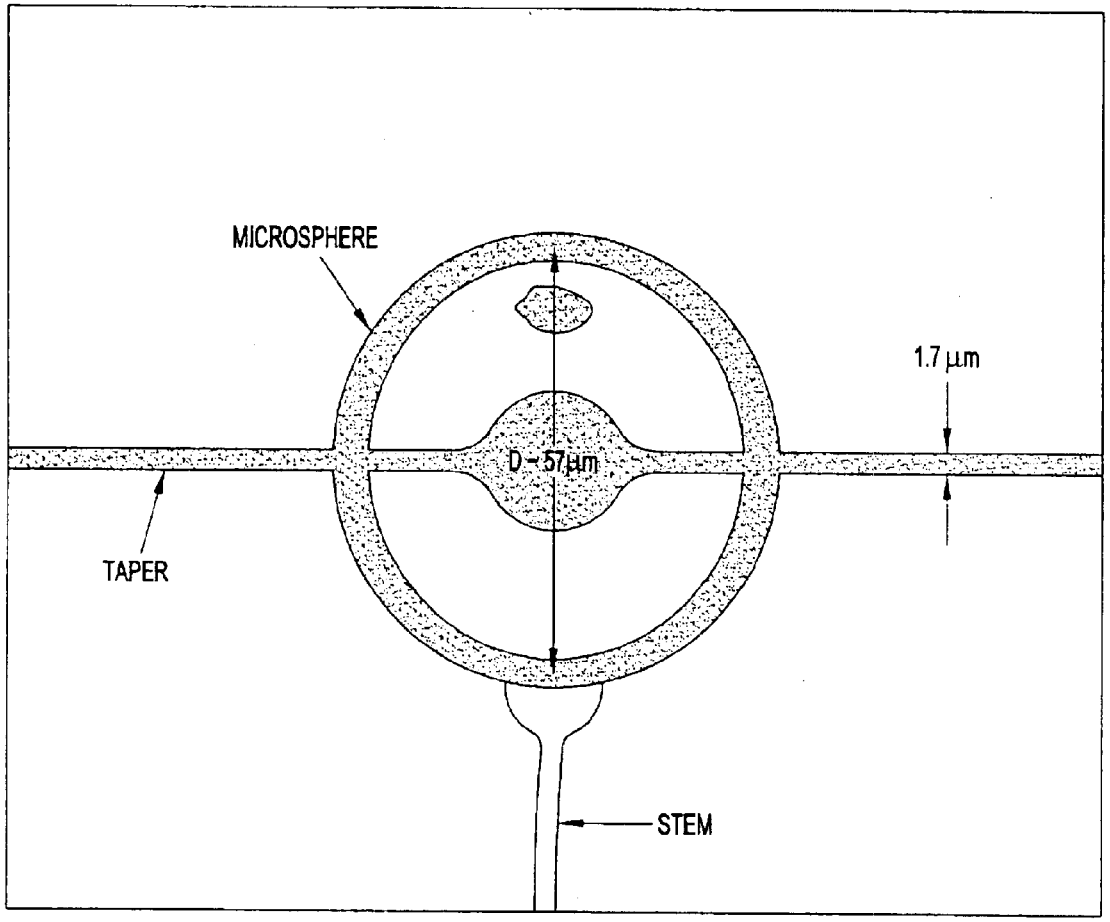
FIG. 3 is an image of a fiber taper in contact with the equator of a microsphere resonator.
Figure 4:
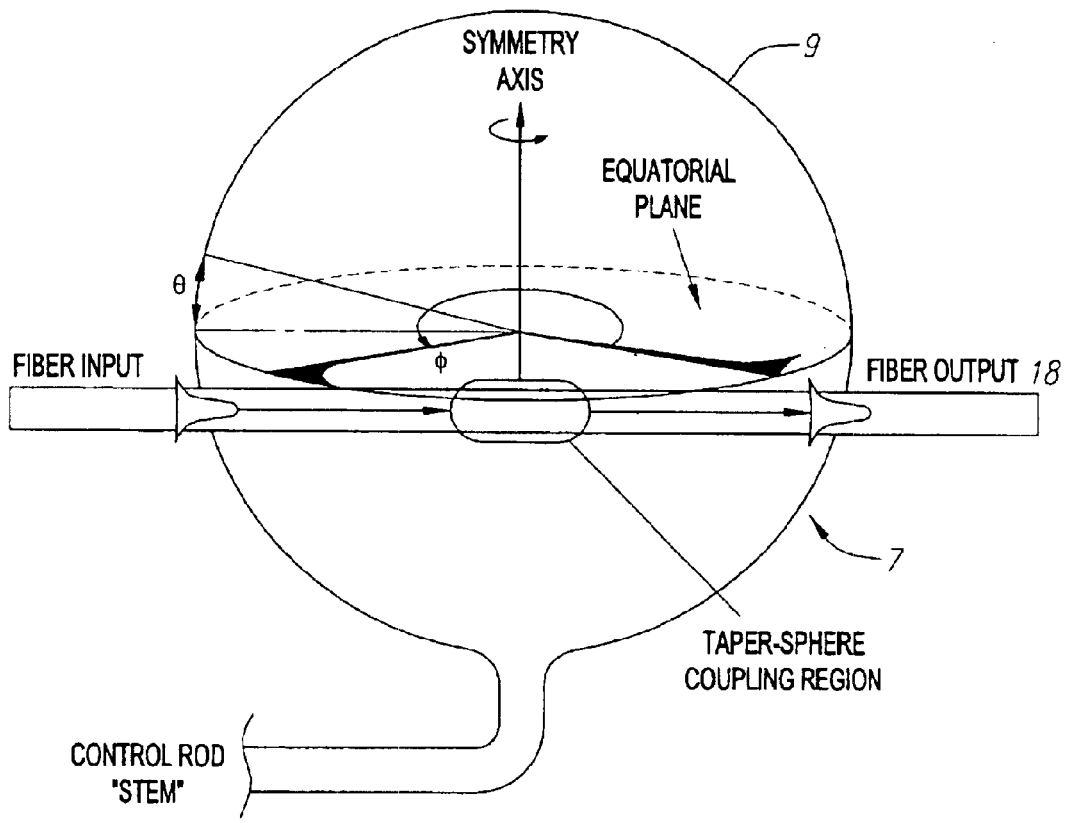
FIG. 4 is an illustration of a fiber taper coupled with the equator of a microsphere micro-cavity resonator.

A magnified image of a coupled fiber taper microsphere is shown in FIG. 3. For the microsphere laser of the present embodiment, the diameter and eccentricity were determined by analysis of its resonant mode structure at 1.5 $\mu$m. The measured WG mode free-spectral range in l($FSR_l$) for this microsphere is 1.1 THz (8.7 nm) at 1.5 $\mu$m, giving a diameter of 57 $\mu$m. The measured free-spectral range in m is 13 GHz for |m|≈l, with the resonant frequencies increasing with decreasing m value. This corresponds to a slightly oblate microsphere with an eccentricity of 2.4%. The pump wave in this embodiment is launched from a 980 nm wavelength, narrow-line width (<300-kHz), tunable external-cavity laser into the fundamental mode of the fiber taper.

As discussed above, this embodiment also maximizes the efficiency of the pumping of the microsphere 9 by providing a good match between the fundamental mode of the fiber taper 12 and the WG modes of the sphere 9 and by matching the input coupling strength to the round-trip resonator loss (i.e., critical coupling). Owing to the large absorption within the microsphere 9 at the pump band and the subsequent large round-trip microsphere resonator loss, maximum power transfer is obtained for the fundamental WG modes (|m|=l), as the spatial overlap with the fiber taper 12 is highest for the equatorial modes, resulting in higher input coupling strengths. For this sphere, a taper diameter of 1.75 micrometers was used to phase match and selectively excite the lowest-order (n=1,2) fundamental WG modes of the sphere 9.

Figure 6:
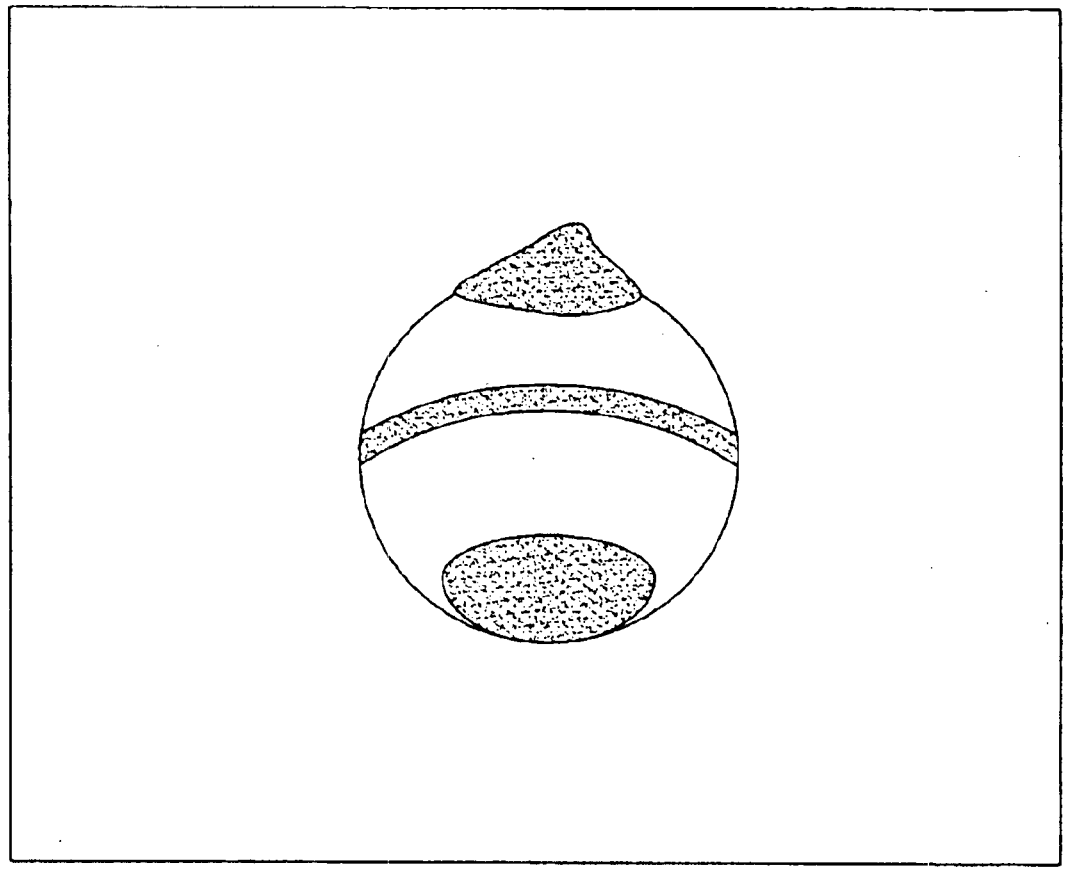
FIG. 6 is an image of the green-up converted photo-luminescence from a fiber taper-pumped microsphere, where the pump wavelength is tuned close to a fundamental whispering gallery mode.

The pump volume within the micro-sphere can be obtained from images of the visible photoluminescence. The green emission is due to spontaneous emission from the up converted $F_{9/2}$ level to the ground state of $Er^{3+}$ and traces the path taken by the 980 nm pump wave within the sphere 9. The image in FIG. 6 shows a ring encircling the equator of the sphere. This equatorial ring corresponds to resonant pumping of a near fundamental WG mode. For this taper-sphere combination, and with resonant pumping of an equatorial WG mode, the scattering loss of the taper-sphere junction is less than 5% (as measured by the off-resonance transmission), and roughly 85% of the pump power is absorbed by the microsphere.

Lasing in the microsphere 9 is rather complex, owing to the large number of high-Q modes that are present in the sphere 9, the spatial selectivity of the pump 20, the loading of the sphere 9 as a result of the taper 12, the large spectral gain bandwidth, and the variations in the emission and absorption cross sections versus wavelength in the phosphate materials. For this reason other resonator geometries such as disks, rings or racetracks may be preferable to obtain a simplified resonator spectrum.

Figure 7:
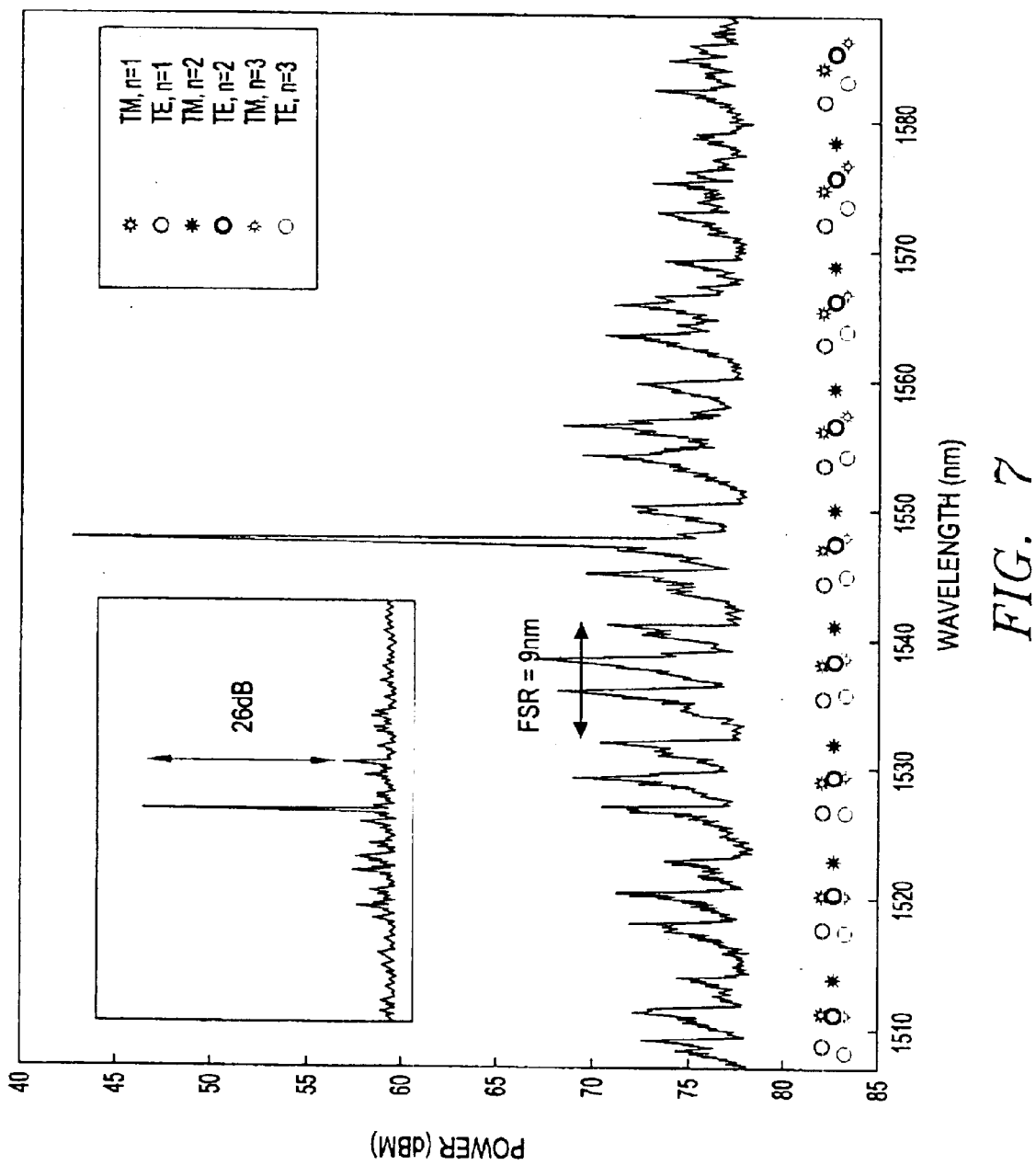
FIG. 7 is an image of photo-luminescence spectra [taken at point (a) in FIG. 8, below] of a microsphere resonator for an annular pump region about the equator. The photo-luminescence (inset) is taken at point (b) in FIG. 8 (with a wavelength range matching that of the main spectra), where the side-mode suppression is 26 dB.

Depending on the gain region within the sphere, lasing occurred at wavelengths ranging from 1530 to 1560 nm in both multimode and single-mode fashion. By adjusting the taper 12 contact position on the sphere 9 and the pump 20 wavelength, it is possible to switch between multi-mode and single-mode lasing action. Single-mode lasing was obtained in this embodiment by tuning the pump wavelength to a fundamental WG mode resonance that produced a narrow equatorial-ring gain region. A typical single-mode lasing spectrum (as collected by the taper 12) for an equatorial-ring pump region is shown in FIG. 7. To resolve the fine spectral features of the laser (different m modes) a high-finesse (~10,000) scanning Fabry-Perot cavity with a spectral resolution of a few megahertz was used to obtain the spectra shown in the inset of FIG. 8. The microsphere of this embodiment of the present invention will lase on a single m WG mode over the entire pump range depicted in FIG. 8.

Figure 8:
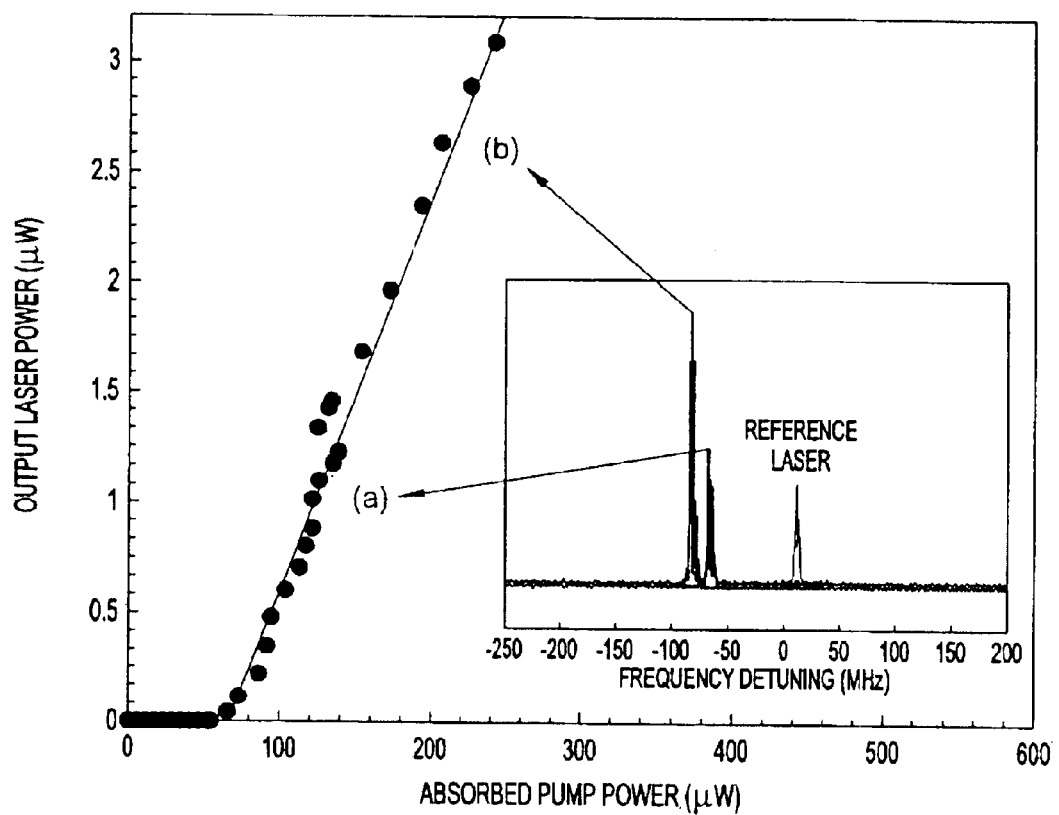
FIG. 8 is a spectral output of collected laser output power versus absorbed pump power in the microsphere ($L_{out}$–$L_{in}$). Inset, spectral output of a Fabry-Perot filter, showing the single-mode nature of the micro-cavity laser of the present invention, where for reference a single-frequency laser with a known line-width of 300 kHz is also shown.

This embodiment of the present invention was also self-pulsing under the pump conditions identified herein, with a period of roughly 15 ms and a pulse width of 500 ns. Instability in the output of this embodiment can be linked to the large unpumped highly absorbing regions within the sphere 9 and the nonlinear dynamics associated with absorption saturation. A plot of the laser power collected in the taper 12 versus the total pump power absorbed and scattered by the presence of the sphere 9 ($L_{out}-L_{in}$) is shown in FIG. 8. The lasing threshold for this embodiment in this configuration is estimated at 60 $\mu$W, and the laser 22 can reach an output power of 3 $\mu$W while remaining single mode. A collected power as high as 10 $\mu$W was obtained in a single line at higher pump power, although the laser 22 was multimode. Given that this embodiment and configuration used the same taper 12 as was used to couple in the 980-nm pump power in the earlier described embodiment, to couple out the 1.5 $\mu$m laser power from the sphere 9, and since the taper was designed to phase match at the 980 nm pump wavelength to reduce the lasing threshold, the laser emission of this embodiment is not optimally collected by the taper 12. A dual-taper system, as is described earlier and in the Cai and Vahala reference above identified, could be employed to likely improve the differential output efficiency.

Figure 9A:
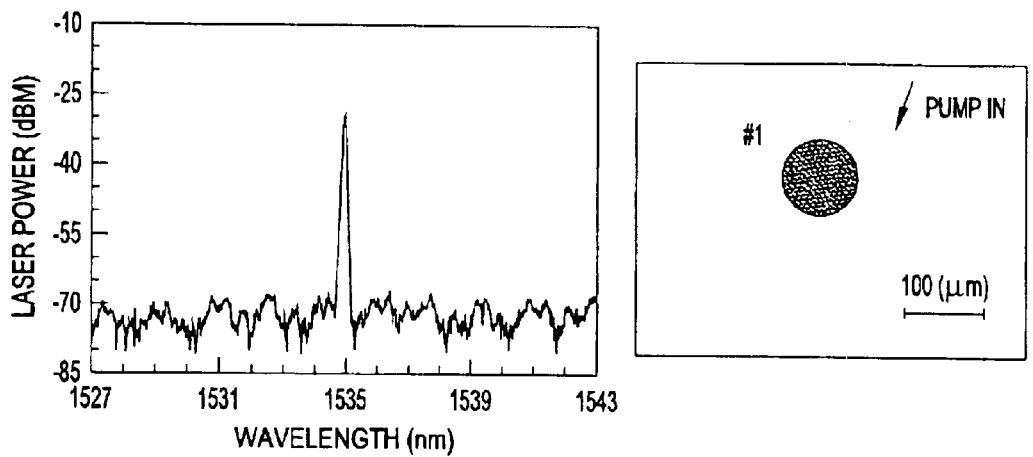
FIG. 9 shows (a) a single sphere system, and (b) a bi-sphere system in which two spheres have been placed on the same taper and pumped by a single 980 nm laser source, producing two separate laser lines, at 1533 and 1535 nm.
Figure 9B:
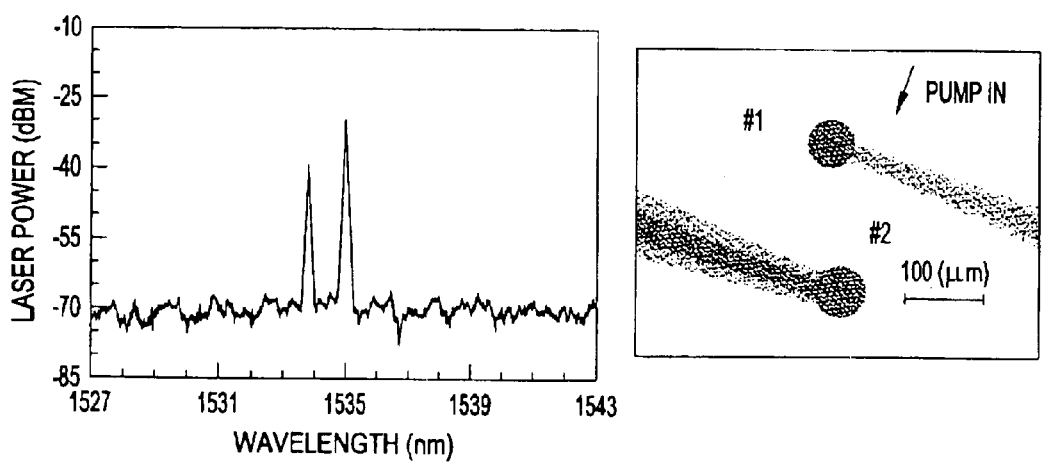

A further embodiment is the use of multiple resonators on a single fiber waveguide 5. This ability to cascade a series of devices is illustrated in FIG. 9, where two phosphate glass microspheres 21, 23 are positioned along a single fiber taper, one after the other. The micro-cavity devices can be the same or different sizes, depending on what the use and purpose the cascading is intended to achieve. FIG. 9 shows a taper with two different-sized microspheres 21, 23 attached. The laser shown in FIG. 9(*a*) has a wavelength of 1535 nm; the laser shown in FIG. 9(*b*) which has a second microsphere 23 placed in contact with the fiber taper, a second laser line at 1533 nm appears. Thus, utilizing multiple resonators in a single fiber can be used to create a laser array.

Each of the characteristics in the present invention are believed to be new and unique, and are not found in the prior art. While the implementations described below are directed to embodiments of a laser which utilize a tapered fiber and a microsphere resonator, it will be understood by those skilled in the art that such configurations and/or combinations are merely embodiment of the present inventions. Thus, none of the embodiments are intended to be limitations on the scope of the invention described herein and set forth in the claims below.

We claim:

1. A micro-cavity laser comprising:
   a. A fiber waveguide of any configuration for transmission of one or more optical signals, said fiber waveguide having a tapered coupling region, said tapered coupling region being positioned between said first end and said second end of said fiber waveguide;
   b. A micro-cavity optical resonator, said micro-cavity optical resonator being arranged so as to provide evanescent optical coupling between said tapered coupling region of said fiber waveguide and said micro-cavity optical resonator, said micro-cavity optical resonator having at least one optical resonance at a desired frequency output, said micro-cavity including an active medium providing optical gain upon pump excitation; and, c. At least one laser pump, the output of said at least one laser pump being optically connected to said first end of said fiber waveguide to couple optical pump power into said resonator through said tapered coupling region so as to excite at least one resonance in said optical resonator to pump said active medium and induce lasing action in said optical resonator at a frequency different from the optical pump power, the output of said induced lasing action being evanescently coupled into said fiber waveguide.

2. A micro-cavity laser of claim 1 further including a second fiber waveguide, said second fiber waveguide having a coupling region between a first end and a second end of said second fiber waveguide, said second fiber waveguide being optically coupled to said micro-cavity optical resonator.

3. The micro-cavity laser of claim 2 further including at least a second laser pump, the output of said second laser pump is at a frequency different from the output of said first laser pump and is optically connected to said first end of the second fiber waveguide and the output of said second laser pump excites at least one resonance in said micro-cavity optical resonator and thereby pumps the active medium to induce lasing action.

4. The micro-cavity laser of claim 3 wherein the output of at least one of said second set of laser pumps excites at least one resonance in said micro-cavity optical resonator at a frequency different from the resonance excited by the output of said laser pumps optically connected to said first fiber waveguide.

5. The micro-cavity laser of claim 3 wherein the said first fiber waveguide anti said second fiber waveguide are optically coupled to the same micro-cavity resonator mode.

6. The micro-cavity laser of claim 1 wherein said micro-cavity optical resonator is one of a microsphere, disk, ring, and racetrack.

7. The micro-cavity laser of claim 1 wherein said micro-cavity is based on silica.

8. The micro-cavity laser of claim 7 wherein said silica-based micro-cavity is doped with a rare earth element to provide an active medium.

9. The micro-cavity laser of claim 8 wherein said rare earth element is at least one of erbium, ytterbium, praseodymium, neodymium, holmnium, and thulium.

10. The micro-cavity laser of claim 1 wherein said micro-cavity optical resonator is a semiconductor, said semiconductor being arranged to be pumped electrically.

11. The micro-cavity laser of claim 1 wherein the material composition of said micro-cavity includes phosphate glass.

12. The micro-cavity laser of claim 1 wherein said micro-cavity optical resonator includes a plurality of micro-rings in a semiconductor.

13. The micro-cavity laser of claim 1 wherein said micro-cavity optical resonator includes a plurality of micro-rings on an optical fiber.

14. The micro-cavity laser of claim 1 wherein said micro-cavity optical resonator includes a plurality of photonic crystal cavities.

15. The micro-cavity laser of claim 1 wherein the micro-cavity optical resonator includes Bragg gratings in the resonant mode path so as to provide increased spectral purity of the lasing output.

16. The micro-cavity laser of claim 15 wherein the Bragg gratings in the resonant mode path are defined holographically.

17. The micro-cavity laser of claim 1 wherein the micro-cavity optical resonator has at least one preferred output frequency, and further including a frequency selector in the mode path of the micro cavity optical resonator of at least one of the preferred output frequencies of the micro-cavity optical resonator.

18. The micro-cavity laser of claim 1 wherein said micro-cavity optical resonator is on a substrate.

19. A system for producing laser emission in a desired wavelength band, the system comprising:

a. A fiber waveguide of any configuration for transmission of one or more optical signals, said fiber waveguide having a first end and a second end and a tapered coupling region therebetween, said tapered coupling region having a tapered diameter;

b. A micro-cavity optical resonator, said resonator having a mode path diameter, said micro-cavity resonator being constructed from a silica material doped with at least one dopant;

c. Optical gratings, said optical gratings being position in the mode path of at least one resonant frequency of said micro-cavity optical resonator;

d. An alignment structure, said alignment structure being arranged to locate said micro-cavity optical resonator and said fiber waveguide in proximity to one another so as to enable optical coupling between said tapered region of said fiber waveguide and said micro-cavity optical resonator; and, e. A laser pump, said laser pump being optically connected to said first end of said fiber waveguide and being ranged so as to launch one or more signals into said fiber waveguide, said optical pump signals having frequencies which excite resonances in the micro-cavity optical resonator to thereby pump at least one silica dopant to induce lasing emission within a desired output frequency band of the systems said lasing emission being optically coupled into said fiber waveguide.

20. The system of claim 19 wherein at least one of the laser pump source signals is in the 980 nanometer emission band.

21. The system of claim 19 wherein the lasing emission is in the range of 1300–1600 nanometers.

22. The system claim 21 wherein said lasing emission of said system is applied in a telecommunications system.

23. The system of claim 19 wherein said taper section diameter and said mode path diameter are selected to provide optimal phased matching such that the coupling efficiency for pump and laser emission is maximized.

24. The system of claim 19 wherein said fiber waveguide includes at least one additional optical resonator optically coupled thereto at the tapered section, said at least one additional optical resonator doped so as to enable operation as a laser and optically pumped by coupling to said fiber waveguide.

25. The system of claim 24 wherein said fiber waveguide has at least one additional taper coupling sections therein and at least one of said additional doped resonators is coupled to at least one of said additional taper sections in said fiber waveguide.

26. The system of claim 19 wherein the system includes at least one additional fiber waveguide, each said additional fiber waveguide is optically coupled to said micro-cavity resonator and arranged so as to permit additional laser pumping of or laser emission coupling from said micro-cavity optical resonator.

27. The laser of claim 19 wherein said micro-cavity is a sphere, disk, ring or racetrack.

28. The system of claim 19 wherein optical gratings increase the spectral purity of the laser emission by forcing laser oscillation at a desired frequency.

29. The system of claim 19 wherein said dopants include at least one of erbium, ytterbium, praseodymium, neodymium, holmium, and thulium.

30. The system of claim 19 wherein said fiber waveguide is a panda fiber.

31. A micro-cavity laser comprising:
   a. A first fiber waveguide of any configuration for transmission of one or more optical signals, said first fiber waveguide having an evanescent coupling region, said evanescent coupling region being positioned between a first end and a second end of said fiber waveguide;
   b. A micro-cavity optical resonator, said micro-cavity optical resonator being positioned in proximity to said coupling region of said first fiber so as to evanescently couple said fiber coupling region and said micro-cavity optical resonator, said micro-cavity optical resonator having at least one optical resonance at a desired frequency output, said micro-cavity optical resonator comprising an active medium which provides optical gain when excited; and
   c. A laser pump, said laser pump being optically connected to said first end of said fiber waveguide for the purpose of exciting said gain medium so as to induce lasing at one or more frequencies different from the frequency of said optical pump, the output of said induced lasing action being optically coupled to said waveguide.

32. The laser of claim 31 wherein said micro-cavity resonator is on a chip or substrate.

33. The laser of claim 32 wherein said fiber waveguide is an etched fiber.

34. The system of claim 32 wherein said fiber waveguide is a D-fiber.

35. The system of claim 32 wherein said fiber waveguide includes polished fiber half-blocks.

36. The system of claim 32 wherein said fiber waveguide is a panda fiber.

37. The system of claim 32 wherein said waveguide coupling section is phased matched to said resonator such tat the pump coupling and laser emission collection efficiency are maximized.

38. The micro-cavity laser of claim 32 wherein the micro-cavity optical resonator has at least one preferred output frequency, and further including frequency modifier gratings, said gratings being disposed in the mode path of the micro-cavity optical resonator of at least one of the preferred output frequencies of the micro-cavity optical resonator.

39. The micro-cavity laser of claim 32 wherein said micro-cavity optical resonator includes at least one of a micro-disk, ring and racetrack.

40. The micro-cavity laser system of claim 1 wherein the laser system includes at least a second micro-cavity optical resonator, said at least a second micro-cavity resonator including an active medium, said active medium associated with said at least a second micro-cavity optical resonator providing optical gain upon pump excitation at a frequency different than in said first micro-cavity optical resonator.

41. The micro-cavity laser system of claim 1 wherein at least one of said micro-cavity optical resonators is one of a microsphere, disk, ring, and racetrack.

42. The micro-cavity laser system of claim 4 wherein said micro-cavity is based on silica.

43. The micro-cavity laser system of claim 42 wherein said silica-based micro-cavity is doped with a rare earth element to provide an active medium.

44. The micro-cavity laser system of claim 43 wherein said rare earth element is at least one of erbium, ytterbium, praseodymium, neodymium, holmnium, and thulium.

45. A method of fabricating a phosphorus glass microsphere for use in a micro-cavity resonator, the steps comprising:

Melting a small piece of phosphorus glass material in a crucible,

Stabilizing the temperature of said molten phosphorus glass,

Placing the tip of a silica fiber taper into the molten phosphorus glass,

Extracting the silica fiber so that a small phosphate taper is formed on the end of the silica fiber taper;

Melting the end of the phosphate taper until a spheroid forms under surface tension, Quickly cooling the phosphate sphere in a manner which avoids crystallization of the phosphate in the spheroid to an extent which would interfere with the refractive properties of the spheroid as a micro-cavity optical resonator.

46. A micro-cavity laser comprising:
   a. A first and a second fiber waveguides of any configuration for transmission of one or more optical signals, said first and said second fiber waveguides having a tapered coupling region, said tapered coupling region being positioned between said first end and said second end of said fiber waveguides;
   b. A micro-cavity optical resonator, said micro-cavity optical resonator being arranged so as to provide evanescent optical coupling between said tapered coupling regions of said first and said second fiber waveguides and said micro-cavity optical resonator, said micro-cavity optical resonator having at least one optical resonance at a desired frequency output, said micro-cavity including an active medium providing optical gain upon pump excitation;
   c. At least one laser pump, the output of said at least one laser pump being optically connected to said first end of said first fiber waveguide to couple optical pump power into said resonator through said tapered coupling region of said first fiber waveguide so as to excite at least one resonance in said optical resonator to pump said active medium and induce lasing action in said optical resonator at a frequency different from the optical pump power, the output of said induced lasing action being evanescently coupled into said coupling region of said second fiber waveguide.

47. A micro-cavity laser comprising:
   a. A fiber waveguide of any configuration for transmission of one or more optical signals, said waveguide having a first end and a second end and a tapered region therebetween, said tapered region having a tapered diameter;
   b. A phosphate silica micro-sphere heavily doped with Erbium and Ytterbium, said microsphere being arranged so as to enable weak optical coupling between said microsphere and said tapered region of said fiber waveguide; and c. A laser pump signal, said laser pump signal being transmitted in said fiber waveguide through said tapered region, said laser signal including a frequency which excites a resonance in said silica microsphere and pumps the erbium gain medium to induce laser emission, said laser emission being evanescently coupled to a fiber waveguide.

48. A micro-cavity laser system comprising:

a. A fiber waveguide of any configuration for transmission of one or more optical signals, said fiber waveguide having at least one tapered coupling region, said tapered coupling regions being located between said first you and said second end of said fiber waveguide;

b. A plurality of micro-cavity optical resonators including a first micro-cavity resonator, each said micro-cavity optical resonator being arranged in proximity to at least one of said tapered coupling regions so as to provide optical coupling between said micro-cavity optical resonator and said fiber waveguide through at least one said tapered coupling region of said fiber waveguide, at least one of said micro-cavity optical resonators having at least one optical resonance at a desired frequency output, said first micro-cavity optical resonator including an active medium associated therewith for providing optical gain upon excitation; and c. At least one laser pump, the output of said laser pump being optically connected to said first end of said fiber waveguide to couple optical pump power into at least said first micro-cavity resonator to excite said active medium associated with said first micro-cavity optical resonator and induce lasing action, said lasing output being coupled to said fiber waveguide.

49. The micro-cavity laser system of claim 1 wherein the material composition of at least one micro-cavity resonator includes phosphate glass.

50. The micro-cavity laser of claim 1 wherein said plurality of micro-cavity optical resonators are on a substrate.

51. The micro-cavity laser system of claim 1 wherein said plurality of micro-cavity optical resonator includes a plurality of micro-rings on an optical fiber.

52. The micro-cavity laser system of claim 1 wherein said plurality of micro-cavity optical resonator includes a plurality of photonic crystal cavities.

53. The micro-cavity laser system of claim 1 wherein said plurality of micro-cavity optical resonator is on a substrate material which is a semiconductor.

54. The micro-cavity laser system of claim 48 wherein said plurality of micro-cavity optical resonators are semiconductor based, said semiconductor being electrically pumped.

55. A method of producing a laser signal of a desired frequency, the steps comprising:

Launching at least one signal into a fiber waveguide of any configuration for transmission of one or more optical signals, said waveguide having a tapered coupling region, said tapered coupling region being optically coupled to a micro-cavity resonator, said micro-cavity resonator containing a gain medium and being resonant and critically coupled to the signal so as to permit excitation of the gain medium and lasing in a desired emission band.

56. The method of producing a microsphere of claim 55 wherein said phosphorus glass material is doped with a rare earth element.

57. A method of obtaining a laser signal within a desired frequency range, the steps comprising:

Receiving a laser signal in a waveguide, said waveguide being optically connected to a fiber waveguide of any configuration for transmission of one or more optical signals, said fiber waveguide having a fiber tapered coupling region therein, said tapered coupling region being optically coupled to a micro-cavity resonator, and said micro-cavity resonator having a resonance at the desired output frequency, said micro-cavity resonator receiving a laser signal for pumping a gain medium therein, said received laser signal being at a frequency different from the desired output frequency.

58. The method of claim 57 wherein said dopant includes Erbium.

59. The method of claim 57 wherein said dopant includes Ytterbium.

60. A micro-cavity laser comprising:

a. A fiber waveguide of any configuration for transmission of one or more optical signals, said fiber waveguide having a tapered coupling region, said tapered coupling region being positioned between said first end and said second end of said fiber waveguide;

b. A micro-cavity optical resonator, said micro-cavity optical resonator being arranged so as to provide evanescent optical coupling between said tapered coupling region of said fiber waveguide and said micro-cavity optical resonator, said micro-cavity optical resonator having at least one optical resonance at a desired frequency output, said micro-cavity including an active medium providing optical gain upon pump excitation and wherein the material composition of said microcavity includes phosphate glass; and, c. At least one laser pump, the output of said at least one laser pump being optically connected to said first end of said fiber waveguide to couple optical pump power into said resonator through said tapered coupling region so as to excite at least one resonance in said optical resonator to pump said active medium and induce lasing action in said optical resonator at a frequency different from the optical pump power, the output of said induced lasing action being evanescently coupled into said fiber waveguide.

61. The micro-cavity laser of claim 60 wherein the micro-cavity optical resonator includes Bragg gratings in the resonant mode path so as to provide increased spectral purity of the lasing output.

62. The micro-cavity laser of claim 61 wherein the Bragg gratings in the resonant mode path are defined holographically.

63. A micro-cavity laser system comprising:

a. A fiber waveguide of any configuration for transmission of one or more optical signals, said fiber waveguide having at least one tapered coupling region, said tapered coupling regions being located between said first end and said second end of said fiber waveguide;

b. A plurality of micro-cavity optical resonators including a first micro-cavity resonator, each said micro-cavity optical resonator being arranged in proximity to at least one of said tapered coupling regions so as to provide optical coupling between said micro-cavity optical resonator and said fiber waveguide through at least one said tapered coupling region of said fiber waveguide, at least one of said micro-cavity optical resonators having at least one optical resonance at a desired frequency output, said first micro-cavity optical resonator including an active medium associated therewith for providing optical gain upon excitation, the material composition of at least one of the micro-cavity resonators including phosphate glass; and c. At least one laser pump, the output of said laser pump being optically connected to said first end of said fiber waveguide to couple optical pump power into at least said first micro-cavity resonator to excite said active medium associated with said first micro-cavity optical resonator and induce lasing action, said lasing output being coupled to said fiber waveguide.

64. A micro-cavity laser comprising:

a. A fiber waveguide of any configuration for transmission of one or more optical signals, said fiber waveguide having a tapered coupling region, said tapered coupling region being positioned between said first end and said second end of said fiber waveguide;

b. A micro-cavity optical resonator, said micro-cavity optical resonator being arranged so as to provide evanescent optical coupling between said tapered coupling region of said fiber waveguide and said micro-cavity optical resonator, said micro-cavity optical resonator having at least one optical resonance at a desired frequency output, said micro-cavity including an active medium providing optical gain upon pump excitation, the coupling efficiency between said fiber waveguide and said micro-cavity optical resonator being greater than 10 percent; and, c. At least one laser pump, the output of said at least one laser pump being optically connected to said first end of said fiber waveguide to couple optical pump power into said resonator through said tapered coupling region so as to excite at least one resonance in said optical resonator to pump said active medium and induce lasing action in said optical resonator at a frequency different from the optical pump power, the output of said induced lasing action being evanescently coupled into said fiber waveguide.

* * * * *

UNITED STATES PATENT AND TRADEMARK OFFICE
CERTIFICATE OF CORRECTION

PATENT NO. : 6,741,628 B2 Page 1 of 1
DATED : May 25, 2004
INVENTOR(S) : O. Painter et al.

It is certified that error appears in the above-identified patent and that said Letters Patent is hereby corrected as shown below:

Column 1,
Line 7, after "in full hereat.", insert:
-- STATEMENT REGARDING FEDERALLY SPONSORED RESEARCH
The U.S. Government has certain rights in this invention pursuant to Grant No. N00014-99-1-0661 awarded by the Office of Naval Research. --

Signed and Sealed this

Twenty-eighth Day of June, 2005

JON W. DUDAS
*Director of the United States Patent and Trademark Office*